US011264252B2

(12) United States Patent
Willwerth et al.

(10) Patent No.: US 11,264,252 B2
(45) Date of Patent: Mar. 1, 2022

(54) CHAMBER LID WITH INTEGRATED HEATER

(71) Applicant: Applied Materials, Inc., Santa Clara, CA (US)

(72) Inventors: Michael D. Willwerth, Campbell, CA (US); Jeffrey Ludwig, San Jose, CA (US); Benjamin Schwarz, San Jose, CA (US); Roberto Cesar Cotlear, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 148 days.

(21) Appl. No.: 16/561,907

(22) Filed: Sep. 5, 2019

(65) Prior Publication Data

US 2020/0118844 A1 Apr. 16, 2020

Related U.S. Application Data

(60) Provisional application No. 62/745,019, filed on Oct. 12, 2018.

(51) Int. Cl.
*H01L 21/67* (2006.01)
*H01J 37/32* (2006.01)

(52) U.S. Cl.
CPC .. *H01L 21/67063* (2013.01); *H01J 37/32477* (2013.01); *H01J 37/32522* (2013.01)

(58) Field of Classification Search
CPC .......... H01J 37/32477; H01J 37/32522; H01L 21/6719; H01L 21/67103; H01L 21/67063
See application file for complete search history.

(56) References Cited

U.S. PATENT DOCUMENTS

| 2013/0098895 | A1* | 4/2013 | Swanson ............... H05B 1/0202 219/508 |
| 2013/0189848 | A1* | 7/2013 | Willwerth ............... H05B 6/02 438/710 |
| 2014/0196849 | A1* | 7/2014 | Nguyen ............... H01J 37/321 156/345.29 |
| 2015/0129165 | A1 | 5/2015 | Parkhe et al. |
| 2016/0254123 | A1 | 9/2016 | Willwerth et al. |
| 2016/0372307 | A1 | 12/2016 | Yang et al. |
| 2018/0213608 | A1 | 7/2018 | Benjaminson et al. |

FOREIGN PATENT DOCUMENTS

| JP | 2014500576 A | 1/2014 |
| KR | 101440945 B1 | 9/2014 |

OTHER PUBLICATIONS

International Search Report and Written Opinion for Application No. PCT/US2019/049705 dated Jan. 14, 2020.

* cited by examiner

*Primary Examiner* — Yuechuan Yu
(74) *Attorney, Agent, or Firm* — Patterson + Sheridan, LLP

(57) ABSTRACT

Implementations described herein provide a chamber lid assembly. In one embodiment, a chamber lid assembly includes a heater embedded in a dielectric body forming a boundary of a processing chamber, wherein the heater has one or more heating zones that are independently controlled.

20 Claims, 4 Drawing Sheets

CHAMBER LID WITH INTEGRATED HEATER

CROSS-REFERENCE TO RELATED APPLICATION

This application claims benefit of U.S. Provisional Patent Application Ser. No. 62/745,019, filed Oct. 12, 2018, which is hereby incorporated by reference herein.

BACKGROUND

Field

Embodiments disclosed herein generally relate to semiconductor manufacturing and more particularly to a lid assembly with an integrated heater and method of using the same.

Description of the Related Art

In manufacture of integrated circuits, precise control of various process parameters is required for achieving consistent results within a substrate, as well as the results that are reproducible from substrate to substrate. As the feature size of the device patterns get smaller, the critical dimension (CD) requirements of these features become a more important criterion for stable and repeatable device performance. As the geometry limits of the structures for forming semiconductor devices are pushed against technology limits, tighter tolerances and precise process control are critical to fabrication success. However, with shrinking geometries, precise critical dimension and etch process control has become increasingly difficult. Allowable CD variation across a substrate processed within a processing chamber is difficult to achieve due to chamber asymmetries such as chamber and substrate temperature, flow conductance, and radio frequency fields.

Many semiconductor devices are processed in the presence of a plasma. If the plasma is not uniformly controlled, processing results may also by non-uniform. Conventional plasma chambers typically include a lid that forms a boundary of the chamber. A plasma source is positioned adjacent to the lid to produce the plasma in the chamber. In some conventional chambers, a discrete heater assembly is positioned between the plasma source and the lid.

However, the heater assembly impacts RF coupling and/or striking performance which negatively affects plasma uniformity in the chamber. Additionally, when performing chamber maintenance, the heater assembly is an additional component that must be removed in order to remove the lid.

Thus, there is a need for an improved chamber lid that provides aspects that improve plasma processing.

SUMMARY

Implementations described herein provide a chamber lid assembly. In one embodiment, a chamber lid assembly includes a heater embedded in a dielectric body forming a boundary of a processing chamber, wherein the heater has one or more heating zones that are independently controlled.

In another embodiment, a processing chamber includes a chamber body, a substrate support assembly disposed in the chamber body, and a lid assembly. The lid assembly includes a heater embedded in a dielectric body, wherein the heater has one or more heating zones that are independently controlled.

In another embodiment, a processing chamber includes a chamber body, a substrate support assembly disposed in the chamber body, and a lid assembly. The lid assembly includes a heater embedded in a dielectric body, and an electromagnetic shield embedded in the dielectric body adjacent to the heater, wherein the heater has one or more heating zones that are independently controlled.

BRIEF DESCRIPTION OF THE DRAWINGS

So that the manner in which the above recited features of the present disclosure can be understood in detail, a more particular description of the disclosure, briefly summarized above, may be had by reference to embodiments disclosed herein, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Embodiments disclosed herein provide a chamber lid assembly with an integral heater and a processing chamber having the same. The chamber lid assembly may be utilized in an etch chamber to improve plasma striking as well as plasma uniformity. Although the chamber lid assembly is described below in an etch processing chamber, the chamber lid assembly may be utilized in other types of plasma processing chambers, such as physical vapor deposition chambers, chemical vapor deposition chambers, ion implantation chambers, stripping chambers, among others, as well as other plasma systems where tuning of a plasma profile is desirable.

Figure 1:
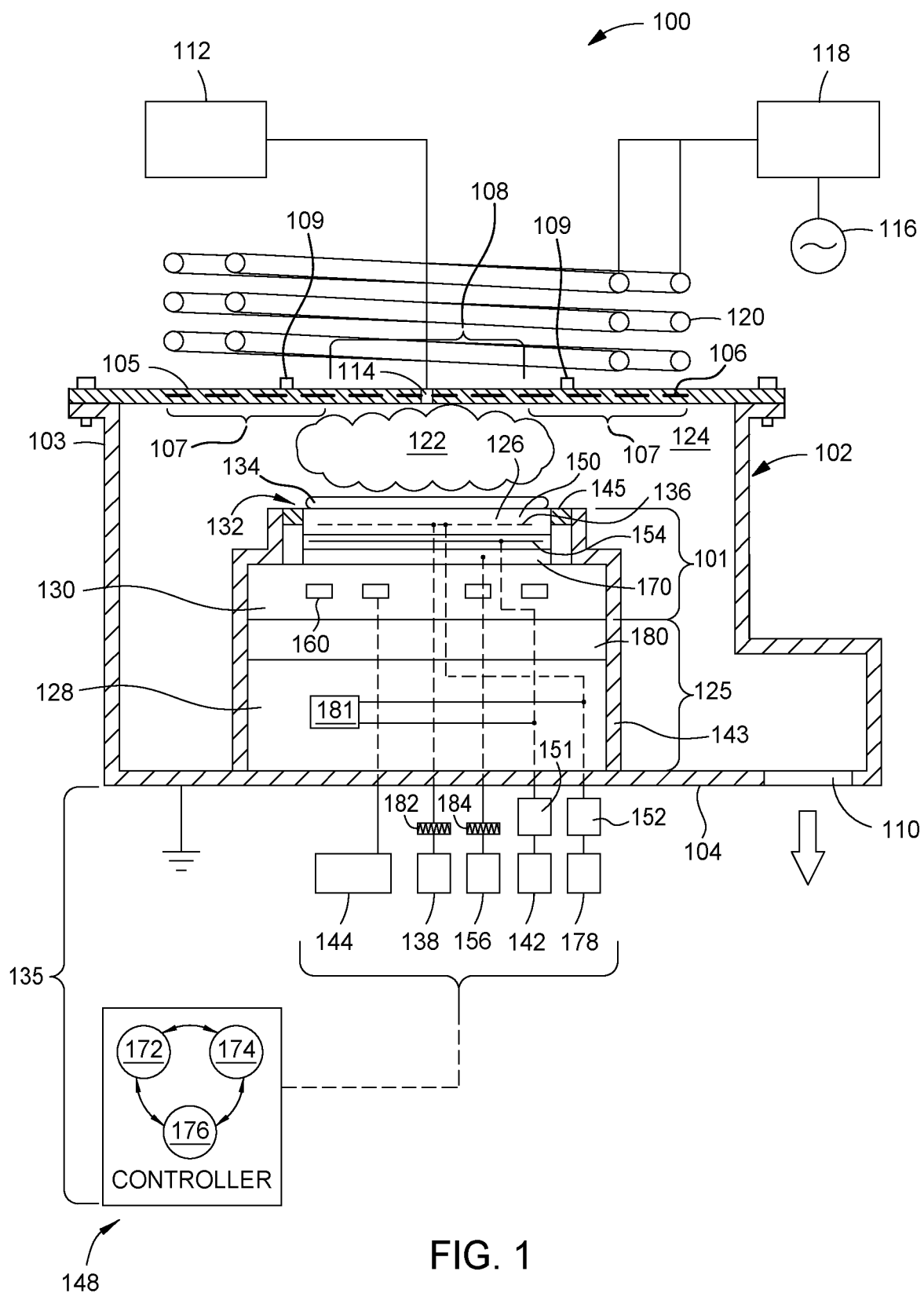
FIG. 1 is a cross-sectional schematic view of an exemplary etch processing chamber having one embodiment of a substrate support assembly.

FIG. 1 is a cross-sectional schematic view of an exemplary etch processing chamber 100 having a substrate support assembly 101 and a grounded chamber body 102. The chamber body 102 includes walls 103, a bottom 104 and a chamber lid assembly 105 which enclose an internal volume 124. The substrate support assembly 101 is disposed in the internal volume 124 and supports a substrate 134 thereon during processing. The walls 103 of the processing chamber 100 include an opening (not shown) through which the substrate 134 may be robotically transferred into and out of the internal volume 124. A pumping port 110 is formed in one of the walls 103 or the bottom 104 of the chamber body 102, and is fluidly connected to a pumping system (not shown). The pumping system is utilized to maintain a vacuum environment within the internal volume 124 of the processing chamber 100, while removing processing byproducts.

The chamber lid assembly 105 includes a heater 106 embedded therein. The chamber lid assembly 105 includes multiple zones, shown as an outer zone 107 and an inner zone 108. The outer zone 107 and the inner zone 108 are independently controlled. The chamber lid assembly 105 also includes one or more temperature probes 109. The temperature probes 109 are utilized to monitor temperature of the outer zone 107 and the inner zone 108 of the chamber lid assembly 105.

A gas panel 112 provides process and/or other gases to the internal volume 124 of the processing chamber 100 through one or more inlet ports 114 formed through at least one of the lid 105 or walls 103 of the chamber body 102. The process gas provided by the gas panel 112 is energized within the internal volume 124 to form a plasma 122. The plasma 122 is utilized to process the substrate 134 disposed on the substrate support assembly 101. The process gases may be energized by RF power inductively coupled to the process gases from a plasma applicator 120 positioned outside the chamber body 102. In the exemplary embodiment depicted in FIG. 1, the plasma applicator 120 is a pair of coaxial coils coupled through a matching circuit 118 to an RF power source 116. In other embodiments (not shown), the plasma applicator may be an electrode, such as a showerhead, that may be used in a capacitively coupled plasma system. The plasma 122 may also be formed utilizing other techniques. In some embodiments, the chamber lid assembly 105 includes a plasma resistant coating provided on an inside surface thereof (e.g., on the side facing the plasma 122).

The substrate support assembly 101 generally includes at least a substrate support 132. The substrate support 132 may be a vacuum chuck, an electrostatic chuck, a susceptor, or other substrate support surface. In the embodiment of FIG. 1, the substrate support 132 is an electrostatic chuck and will be described hereinafter as an electrostatic chuck 126.

The substrate support assembly 101 may additionally include a heater assembly 170. The substrate support assembly 101 may also include a cooling base 130. The cooling base 130 may be coupled to a heat transfer fluid source 144. The heat transfer fluid source 144 provides a heat transfer fluid, such as a liquid, gas or combination thereof, which is circulated through one or more conduits 160 disposed in the cooling base 130. The heater assembly 170 is coupled to a heater power source 156 that may be used to control power to the resistive heaters. The heater power source 156 may be coupled through an RF filter 184. The RF filter 184 may be used to protect the heater power source 156 from the RF energy. The electrostatic chuck 126 may include one or more temperature sensors (not shown) for providing temperature feedback information to the controller 148 for controlling the power applied by the heater power source 156 and for controlling the operations of the cooling base 130.

The substrate support assembly 101 may be removably coupled to a support pedestal 125. The support pedestal 125, which may include a pedestal base 128 and a facility plate 180, is mounted to the chamber body 102. The pedestal base 128 may comprise a dielectric material that electrically insulates electrically conductive portions of the substrate support assembly 101 from the chamber body 102. The substrate support assembly 101 may be periodically removed from the support pedestal 125 to allow for refurbishment of one or more components of the substrate support assembly 101.

The substrate support assembly 101 includes a chucking electrode 136, which may be a mesh of a conductive material. The chucking electrode 136 is coupled to a chucking power source 138 that, when energized, electrostatically clamps the substrate 134 to the workpiece support surface 133. The electrostatic chuck 126 generally includes the chucking electrode 136 embedded in a dielectric puck or body 150. The dielectric body 150, as well as other portions of the substrate support assembly 101 and the support pedestal 125, may be disposed within an insulator ring 143. The insulator ring 143 may be a dielectric material, such as quartz or other dielectric material that is process compatible. A focus ring 145 may be disposed about a periphery of the dielectric body 150. The focus ring 145 may be a dielectric or conductive material and may comprise the same material as the substrate 134. The focus ring 145 may be utilized to extend the surface of the substrate 134 with respect to the electromagnetic field of the plasma 122. The focus ring 145 may also minimize the enhancement of electromagnetic field at the edge of the substrate 134, as well as minimize the chemistry effects due to the change in materials at this interface.

The chucking electrode 136 may be configured as a mono polar or bipolar electrode, or have another suitable arrangement. The chucking electrode 136 is coupled through an RF filter 182 to a chucking power source 138 which provides direct current (DC) power to electrostatically secure the substrate 134 to the upper surface of the dielectric body 150. The RF filter 182 prevents RF power utilized to form the plasma 122 within the processing chamber 100 from damaging electrical equipment or presenting an electrical hazard outside the chamber. The dielectric body 150 may be fabricated from a ceramic material, such as AlN or $Al_2O_3$. Alternately, the dielectric body 150 may be fabricated from a polymer, such as polyimide, polyetheretherketone, polyaryletherketone and the like.

A power application system 135 is coupled to the substrate support assembly 101. The power application system 135 may include the chucking power source 138, a first radio frequency (RF) power source 142, and a second RF power source 178. Embodiments of the power application system 135 may additionally include a controller 148, and a sensor device 181 that is in communication with the controller 148 and both of the first RF power source 142 and the second RF power source 178.

The controller 148 may be one of any form of general-purpose data processing system that can be used in an industrial setting for controlling the various sub-processors and sub-controllers. Generally, the controller 148 includes a central processing unit (CPU) 172 in communication with memory 174 and input/output (I/O) circuitry 176, among other common components. Software commands executed by the CPU of the controller 148, cause the processing chamber to, for example, introduce an etchant gas mixture (i.e., processing gas) into the internal volume 124. The controller 148 may also be utilized to control the plasma 122 from the processing gas by application of RF power from the plasma applicator 120, the first RF power source 142 and the second RF power source 178 in order to etch a layer of material on the substrate 134.

The heater assembly 170 may also include a second RF electrode 154, and together with the chucking electrode 136, applies RF power to tune the plasma 122. The first RF power source 142 may be coupled to the second RF electrode 154 while the second RF power source 178 may be coupled to the chucking electrode 136. A first matching network 151 and a second matching network 152 may be provided for the first RF power source 142 and the second RF power source 178, respectively. The second RF electrode 154 may be a solid metal plate of a conductive material as shown. Alternatively, the second RF electrode 154 may be a mesh of conductive material.

Figure 2:
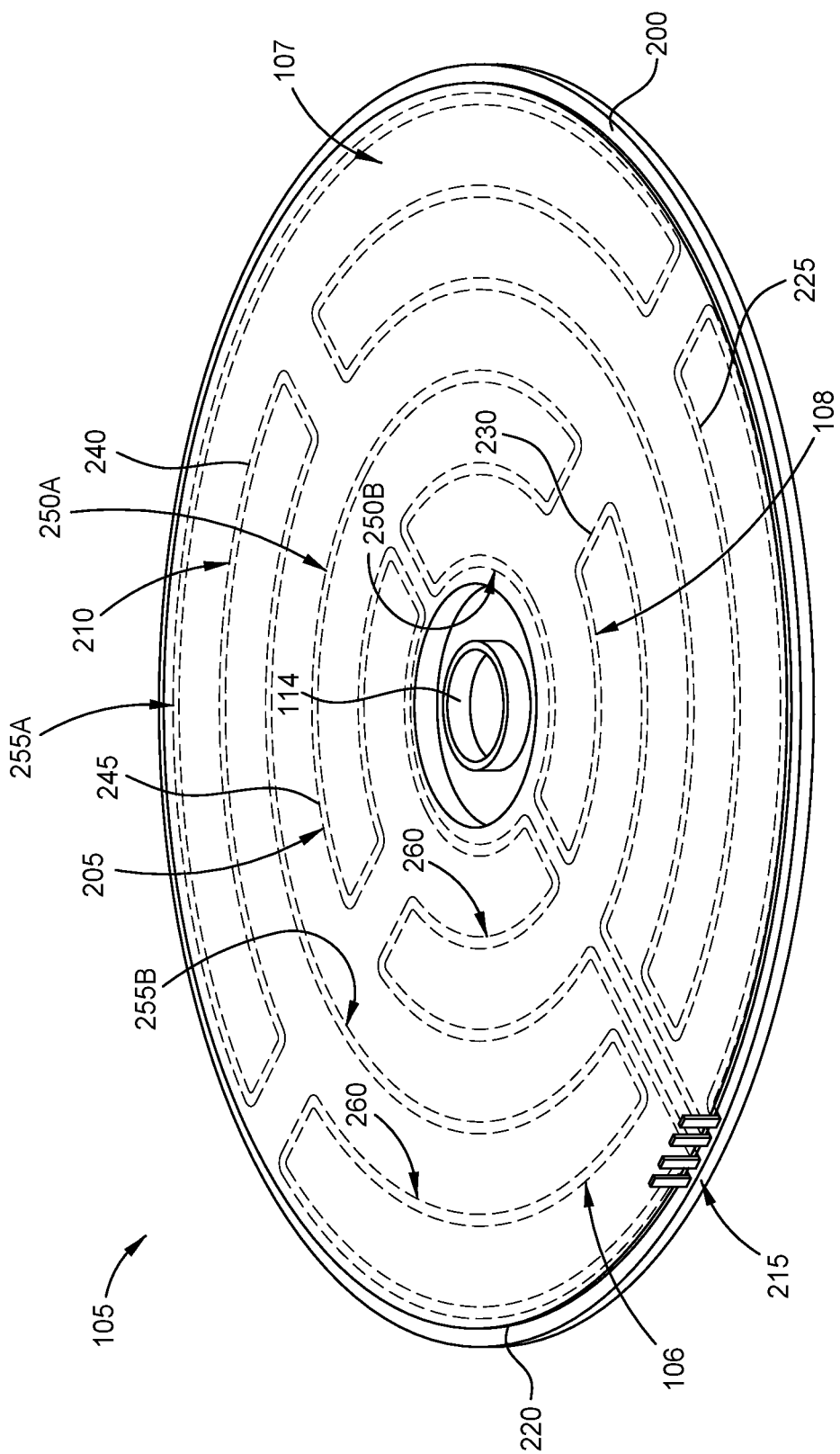
FIG. 2 is an isometric view of the chamber lid assembly according to one embodiment.

FIG. 2 is an isometric view of one embodiment of the chamber lid assembly 105. The chamber lid assembly 105 includes a dielectric body 200. The dielectric body 200 may be fabricated from a ceramic material, such as AlN or $Al_2O_3$. The heater 106 is embedded in the dielectric body 200. The heater 106 includes traces such as an inner trace 205 and an outer trace 210. The inner trace 205 and the outer trace 210 are shown in dashed lines as the traces are embedded within the dielectric body 200. The inner trace 205 forms the inner zone 108 and the outer trace 210 forms the outer zone 107. Both of the inner trace 205 and the outer trace 210 are coupled to a terminal assembly 215 that is coupled to a power supply (not shown). The terminal assembly 215 is positioned on a peripheral edge 220 of the dielectric body 200.

The inner trace 205 and the outer trace 210 comprise a plurality of arc segments 225. A portion of the arc segments 225 are joined by a radially oriented segment 230. The radially oriented segments 230 may be substantially parallel to each other. A portion of the arc segments 225 may be concentric to other arc segments 225. The outer trace 210 includes a conductor 240. The inner trace 205 includes a conductor 245.

The arc segments 225 of the inner trace 205 include a first outer diameter arc segment 250A and a first inner diameter arc segment 250B. Likewise, the arc segments 225 of the outer trace 210 include a second outer diameter arc segment 255A and a second inner diameter arc segment 255B. Each of the inner trace 205 and the outer trace 210 includes a plurality of intermediate arc segments 260.

The chamber lid assembly 105 may be fabricated in layers that are laminated together. For example, green bodies may be formed and the heater 106 may be positioned between the bodies. Then the green bodies are pressed together and fired to cure the green bodies.

Figure 3:
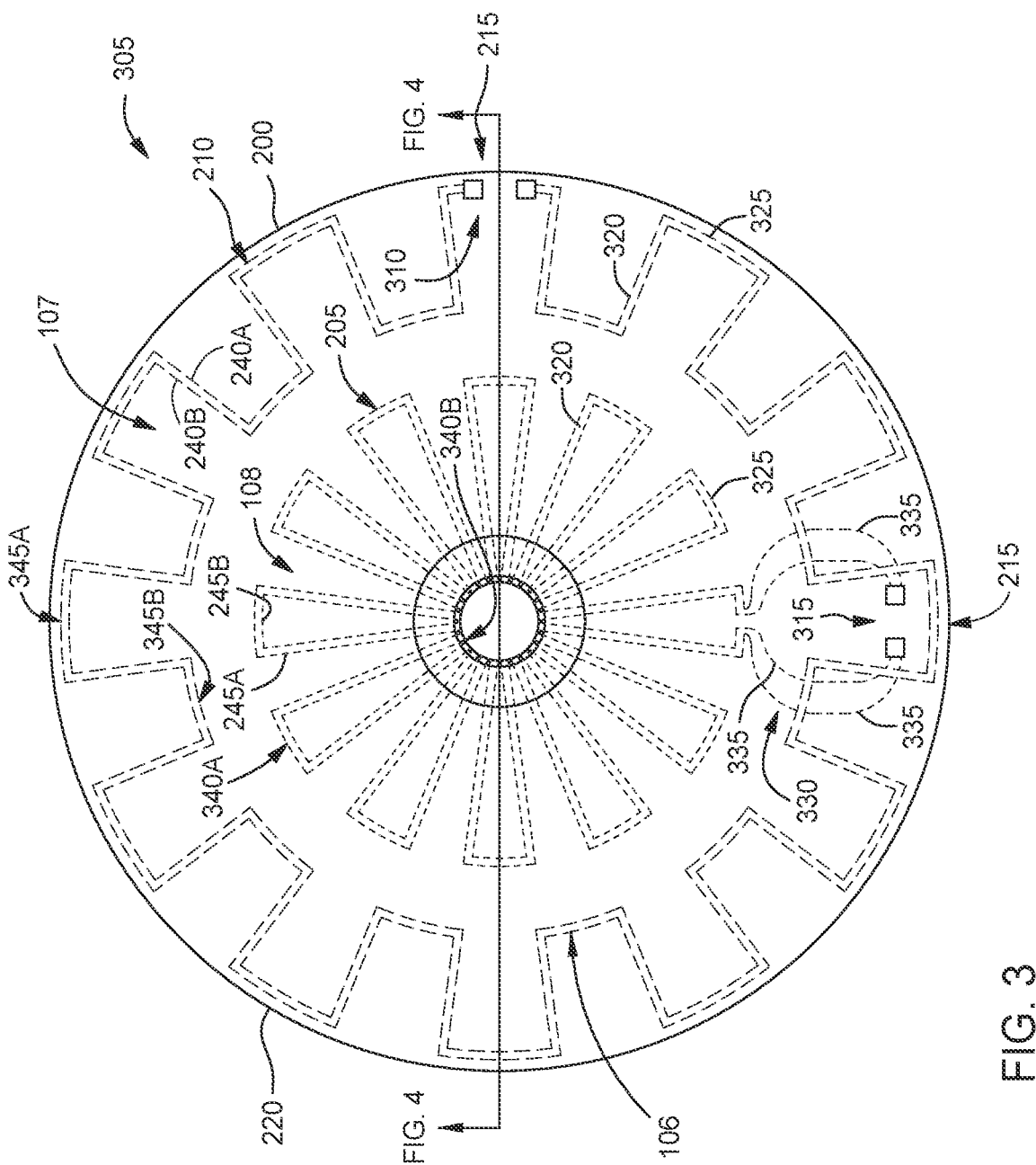
FIG. 3 is a plan view of another embodiment of a chamber lid assembly that may be used with the processing chamber of FIG. 1.

FIG. 3 is a plan view of another embodiment of a chamber lid assembly 305 that may be used with the processing chamber 100 of FIG. 1. The chamber lid assembly 305 includes the dielectric body 200 and may be fabricated similar to the chamber lid assembly 105 described above. The heater 106 is embedded in the dielectric body 200. The heater 106 includes traces such as the inner trace 205 and an outer trace 210. The inner trace 205 and the outer trace 210 are shown in dashed lines as the traces are embedded within the dielectric body 200. The inner trace 205 forms the inner zone 108 and the outer trace 210 forms the outer zone 107. Both of the inner trace 205 and the outer trace 210 are coupled to a terminal assembly 215 that is coupled to a power supply (not shown). The terminal assembly 215 is positioned on the peripheral edge 220 of the dielectric body 200. The terminal assembly 215 is different from FIG. 2 as the terminal assembly 215 includes a first terminal assembly 310 and a second terminal assembly 315 at different positions. The first terminal assembly 310 is provided to power the outer trace 210 and the second terminal assembly 315 is provided to power the inner trace 205. The first terminal assembly 310 and the second terminal assembly 315 may be positioned about 90 degrees from each other.

In this embodiment, the inner trace 205 and the outer trace 210 comprise a plurality of radially oriented spokes 320. A portion of the spokes 320 are joined by an axially oriented arc segment 325. A portion of the arc segments 325 may be concentric to other arc segments 325. Also, in this embodiment, at least the inner trace 205 comprises a heater circuit 330 having conductors 335. The conductors are spaced apart to reduce wattage to the inner trace 205. The outer trace 210 includes an an outer conductor 240A and an outer conductor 240B. The inner trace 205 includes an inner conductor 245A and an inner conductor 245B. The conductors are also spaced apart to reduce heat therebetween.

The axially oriented arc segments 325 join the spokes 320 at a first outer diameter position 340A and a first inner diameter position 340B (for the inner trace 205). Likewise, the axially oriented arc segments 325 join the spokes 320 of the outer trace 210 at a second outer diameter position 345A and a second inner diameter position 345B. The second outer diameter position 345A is located near a perimeter of the dielectric body 200. The second outer diameter position 345A has a diameter that is greater than a diameter of the second inner diameter position 345B. The second inner diameter position 345B has a diameter that is greater than a diameter of the first outer diameter position 340A. The first outer diameter position 340A has a diameter that is greater than a diameter of the first inner diameter position 340B. In some embodiments, the outer trace 210 resembles a circular waveform provided by the spokes 320 and the axially oriented arc segments 325.

Figure 4:
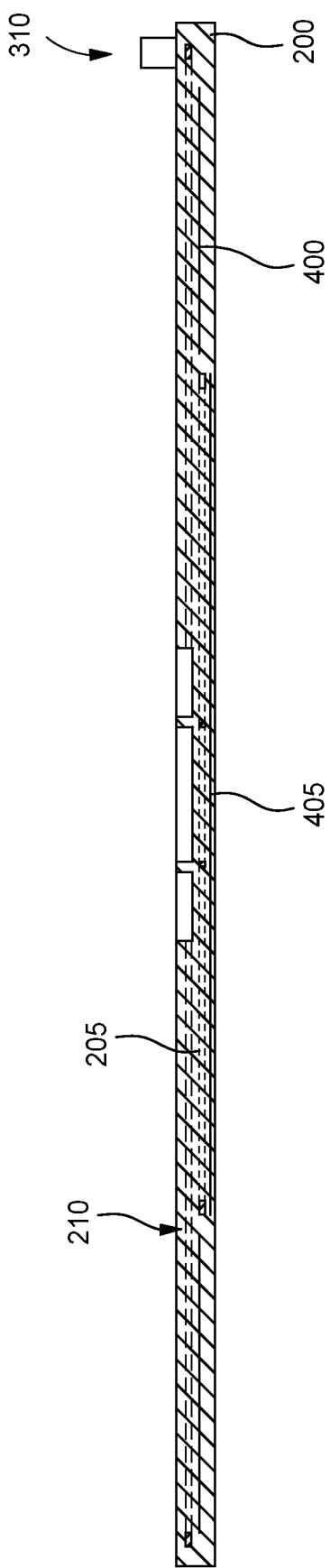
FIG. 4 is a sectional view of the chamber lid assembly along lines 4-4 of FIG. 3.

FIG. 4 is a sectional view of the chamber lid assembly 305 along lines 4-4 of FIG. 3. A portion of the inner trace 205 and the outer trace 210 are shown in dashed lines. Also shown are an outer electromagnetic shield 400 and an inner electromagnetic shield 405 in solid lines. Both of the outer electromagnetic shield 400 and the inner electromagnetic shield 405 function to block electromagnetic energy (e.g., Faraday shields). The outer electromagnetic shield 400 and the inner electromagnetic shield 405 are shown below the outer trace 210 and the inner trace 205, respectively. However, the outer electromagnetic shield 400 and/or the inner electromagnetic shield 405 may be above the inner trace 205 and/or the outer trace 210. The outer electromagnetic shield 400 and the inner electromagnetic shield 405 may be shaped similarly to the outer trace 210 and the inner trace 205 in plan view as shown in FIG. 3. One or both of the outer electromagnetic shield 400 and the inner electromagnetic shield 405 may be a conductive plate or foil, or a mesh.

Conventional plasma chambers having a discrete heater are only capable of a maximum temperature of about 125 degrees Celsius. However, the chamber lid assembly 105 as disclosed herein is adapted to operate at temperatures at about 180 degrees Celsius, or greater. For example, the chamber lid assembly 105 may be heated to about 200 degrees Celsius. The elevated temperatures minimize film deposition thereon. The independent zones of the heater 106 minimize stresses on the lid by minimizing temperature gradients in the lid. In addition, the dual zones are utilized to maintain optimal center to edge substrate temperature.

The chamber lid assembly 105 as disclosed herein improves plasma striking in the processing chamber. The chamber lid assembly 105 as disclosed herein improves etch uniformity by the dual zone temperature control. The chamber lid assembly 105 as disclosed herein also reduces chamber disassembly time.

While the foregoing is directed to implementations of the present disclosure, other and further implementations of the disclosure may be devised without departing from the basic scope thereof, and the scope thereof is determined by the claims that follow.

What is claimed is:

1. A chamber lid assembly, comprising:
a dielectric plate configured to seal a processing chamber; and
a heater disposed within the dielectric plate, wherein the heater has one or more heating zones that are independently controlled, and wherein the heater comprises a plurality of radially oriented spokes, at least a portion of the radially oriented spokes being joined by a first arc segment at an outer diameter position and a second arc segment at an inner diameter position.

2. The lid assembly of claim 1, wherein the dielectric plate comprises a ceramic material.

3. The lid assembly of claim 1, wherein the one or more heating zones comprises an inner zone and an outer zone.

4. The lid assembly of claim 1, wherein the dielectric plate is laminated.

5. The lid assembly of claim 1, wherein the heater is coupled to a terminal assembly.

6. The lid assembly of claim 5, wherein the terminal assembly is positioned on a peripheral edge of the dielectric plate.

7. The lid assembly of claim 1, wherein the heater includes an inner trace and an outer trace.

8. The lid assembly of claim 7, wherein the inner trace and the outer trace include a plurality of arc segments.

9. The lid assembly of claim 8, wherein each of the plurality of arc segments are joined to the radially oriented spokes.

10. A processing chamber, comprising: a chamber body; a substrate support assembly disposed in the chamber body; and a lid assembly, the lid assembly comprising: a dielectric plate configured to seal the processing chamber; and a heater disposed within the dielectric plate, wherein the heater comprises a plurality of radially oriented spokes, at least a portion of which are joined by a first arc segment at an outer diameter position and a second arc segment at an inner diameter position, and wherein the heater has one or more heating zones that are independently controlled.

11. The chamber of claim 10, wherein the one or more heating zones comprises an inner zone and an outer zone.

12. The chamber of claim 10, wherein the dielectric plate is laminated.

13. The chamber of claim 10, wherein the heater is coupled to a terminal assembly.

14. The chamber of claim 13, wherein the terminal assembly is positioned on a peripheral edge of the dielectric plate.

15. The chamber of claim 10, wherein the heater includes an inner trace and an outer trace.

16. The chamber of claim 15, wherein the inner trace and the outer trace include a plurality of arc segments.

17. The chamber of claim 16, wherein a portion of the plurality of arc segments are joined to the radially oriented spokes.

18. A processing chamber, comprising: a chamber body; a substrate support assembly disposed in the chamber body; and a lid assembly, the lid assembly comprising: a dielectric plate configured to seal the processing chamber a heater disposed within the dielectric plate; and an electromagnetic shield embedded in the dielectric plate adjacent to the heater, wherein the heater comprises a plurality of radially oriented spokes, and wherein the heater has one or more heating zones that are independently controlled.

19. The processing chamber of claim 18, wherein the electromagnetic shield is above the heater.

20. The processing chamber of claim 18, wherein the electromagnetic shield comprises a shape that substantially matches a shape of the heater in plan view.

* * * * *